(12) United States Patent
Matsumura

(10) Patent No.: US 6,534,874 B1
(45) Date of Patent: Mar. 18, 2003

(54) SEMICONDUCTOR DEVICE AND METHOD OF PRODUCING THE SAME

(75) Inventor: Kazuhiko Matsumura, Kitakatsuragi-gun (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/688,816

(22) Filed: Oct. 17, 2000

(30) Foreign Application Priority Data

Nov. 2, 1999 (JP) .......................................... 11-312222

(51) Int. Cl.[7] ..................... H01L 23/48; H01L 23/52; H01L 29/40
(52) U.S. Cl. ..................................... 257/777; 438/108
(58) Field of Search .............................. 257/686, 673, 257/685, 700, 701, 737, 777, 698, 774; 365/63

(56) References Cited

U.S. PATENT DOCUMENTS 6,087,719 A * 7/2000 Tsunashima ................ 257/686
6,122,187 A * 9/2000 Ahn et al. ..................... 365/63
6,188,129 B1 * 2/2001 Paik et al. .................. 257/686

* cited by examiner

Primary Examiner—Olik Chaudhuri
Assistant Examiner—Dana Farahari
(74) Attorney, Agent, or Firm—Stevens, Davis, Miller & Mosher, LLP

(57) ABSTRACT

Through holes are provided in the inner electrodes of a second semiconductor chip, electrodes capable of being plated by electroless plating are formed on the inner walls of the through holes while being insulated from other electrodes, the second semiconductor chip is secured with an adhesive to a first semiconductor chip at portions other than the outer electrodes and the inner electrodes of the first semiconductor chip so that the inner electrodes of the first semiconductor chip are aligned with the inner electrodes of the second semiconductor chip, and the inner electrodes and the electrodes on the inner walls of the through holes are electrically connected to each other by continuously extending metals having the same composition. Therefore, a plurality of chips can be stacked without being damaged.

4 Claims, 17 Drawing Sheets

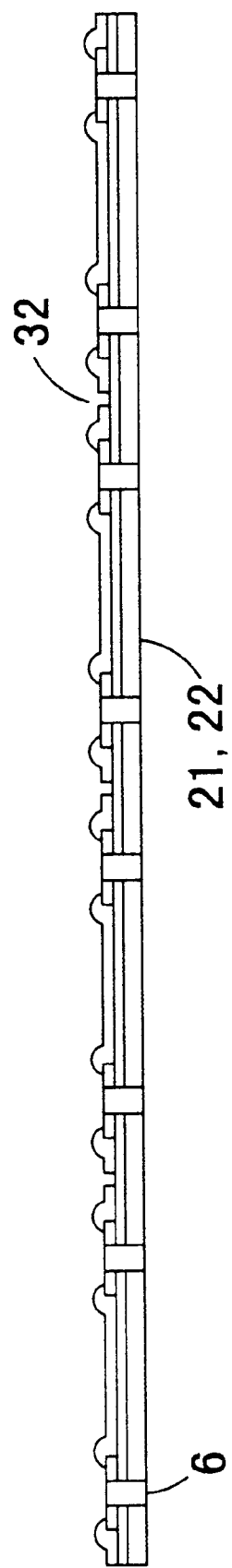
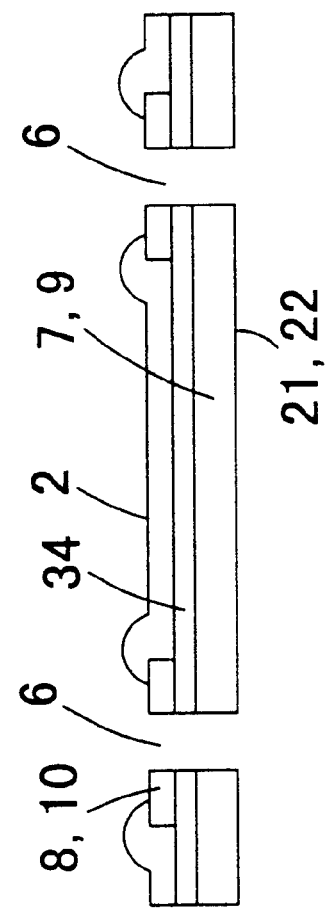
FIG. 3A
FIG. 3B

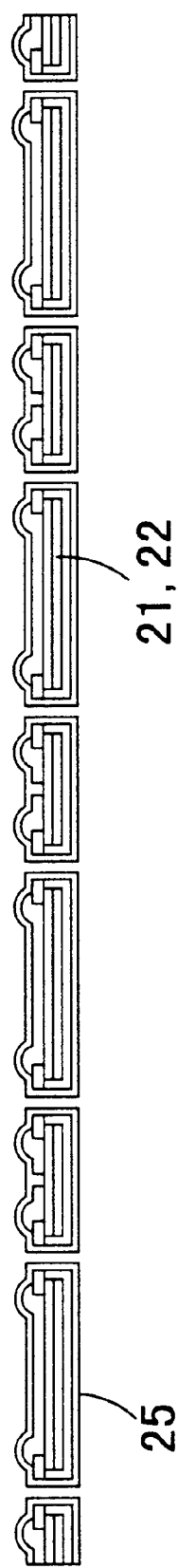
F I G. 5A
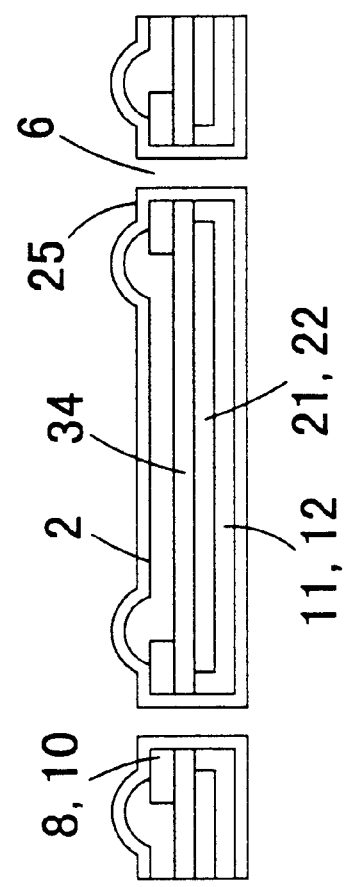
F I G. 5B

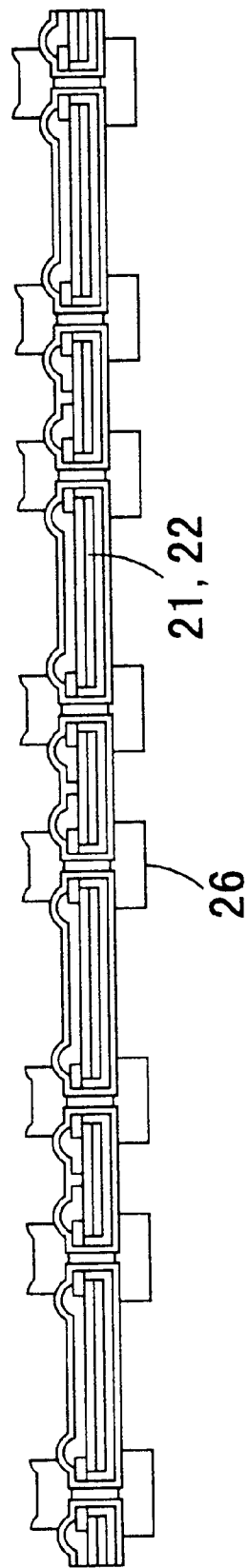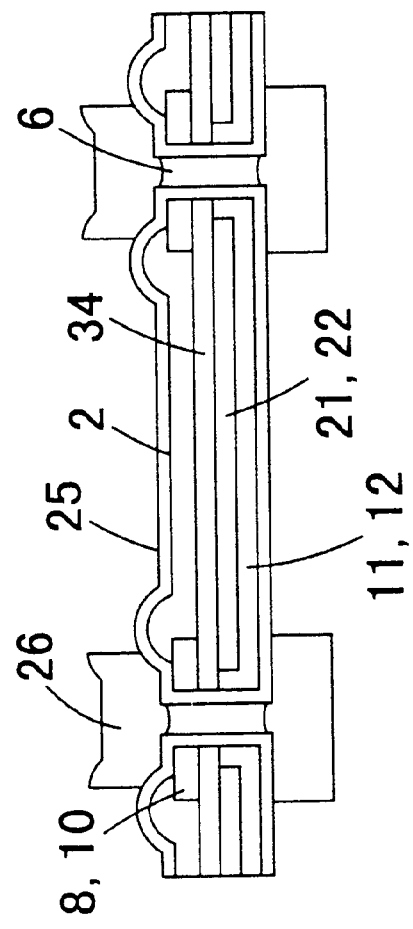

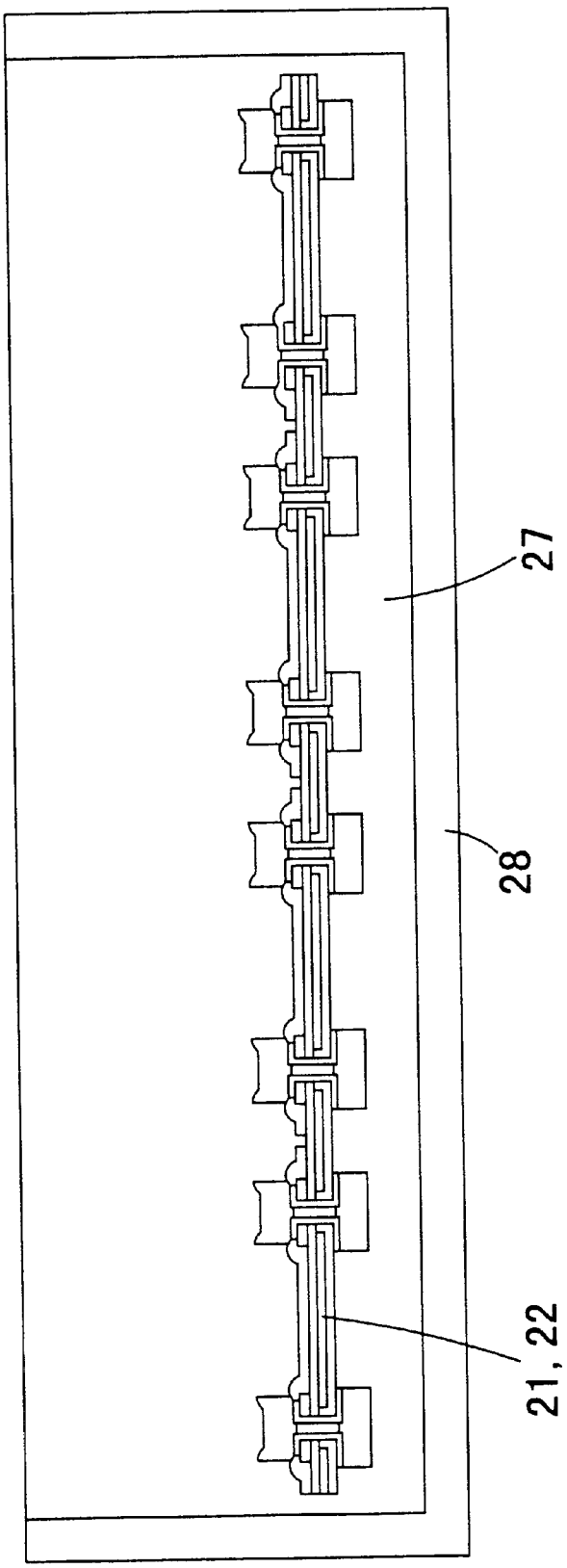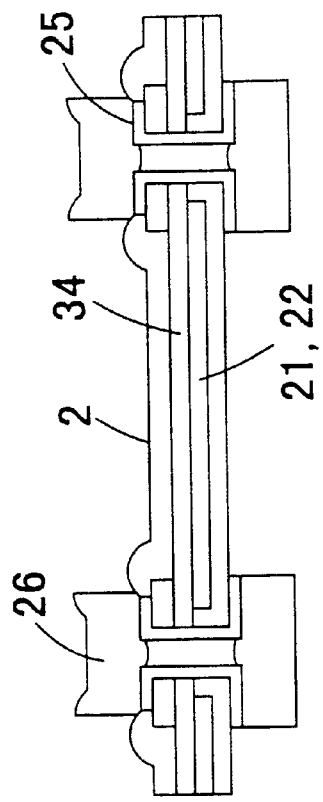

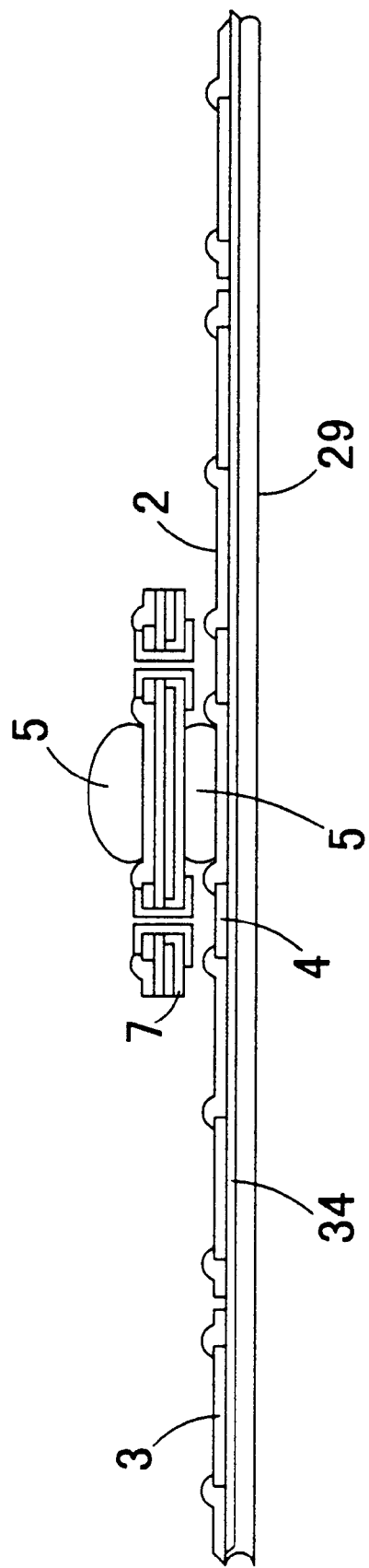

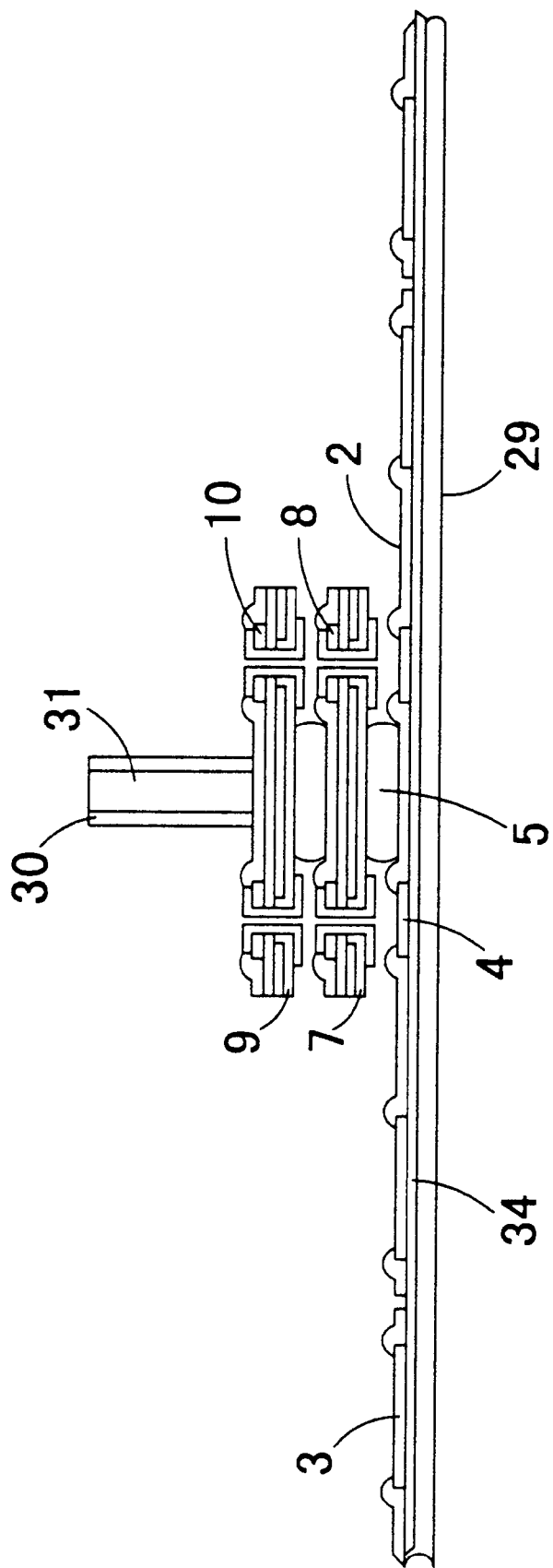

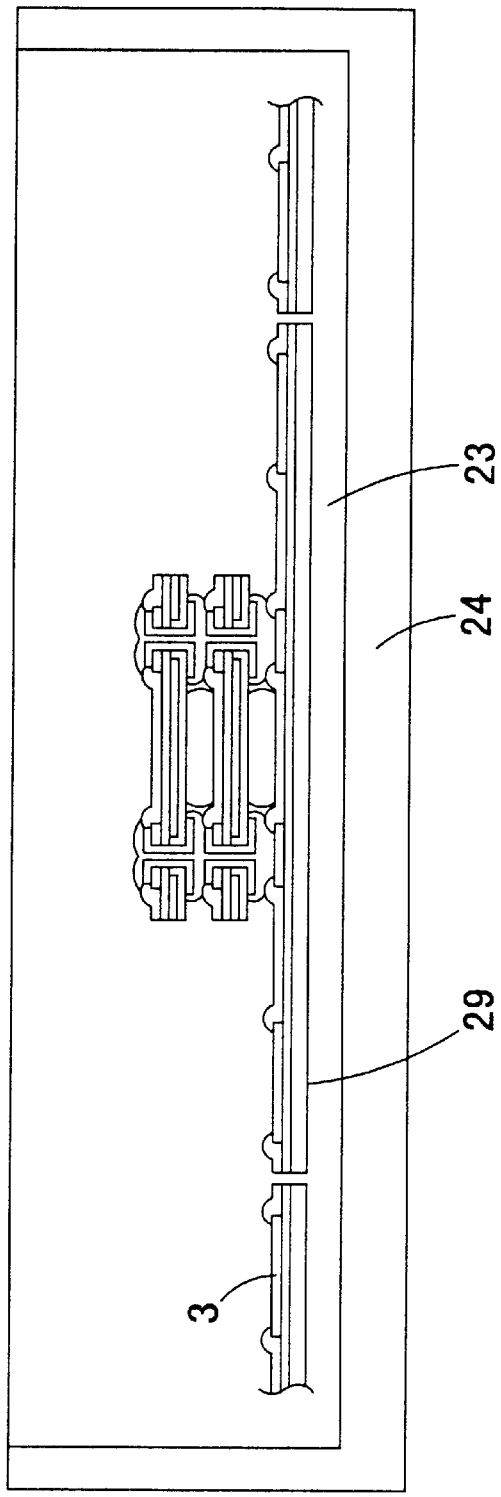
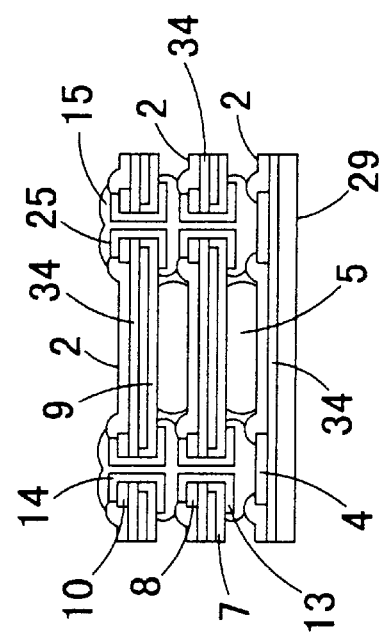
FIG. 14A
FIG. 14B

US 6,534,874 B1

SEMICONDUCTOR DEVICE AND METHOD OF PRODUCING THE SAME

BACKGROUND OF THE INVENTION

1. Field of the Invention

The present invention relates to a semiconductor device and a method of producing the semiconductor device and more particularly to a semiconductor device comprising stacked and electrically connected semiconductor chips having LSIs and a method of producing the semiconductor device.

2. Prior Art

In recent years, inorder to make LSI semiconductor devices lower in cost and smaller in size, a semiconductor device has been proposed wherein semiconductor chips having LSIs provided with functions different from one another or semiconductor chips having LSIs formed by processes different from one another are joined with one another in a face-down method.

The above-mentioned conventional LSI semiconductor device will be described below referring to FIG. 16. First, on a first semiconductor chip 110, the inner electrodes (the first inner electrodes) 111 of the first semiconductor chip and bonding pads 112 are formed. In addition, on the first inner electrodes 111, the barrier metals (the first barrier metals) 113 of the first semiconductor chip are formed. Furthermore, the barrier metals (the second barrier metals) 122 of a second semiconductor chip 120 on the inner electrodes 121 (the second inner electrodes) of the second semiconductor chip 120 are electrically connected to the second inner electrodes 121 on the second semiconductor chip 120 via bumps 123 made of solder. Moreover, the space between the first semiconductor chip 110 and the second semiconductor chip 120 is filled with an insulating resin 130, and the first semiconductor chip 110 and the second semiconductor chip 120 are integrated with each other by the bumps 123 and the insulating resin 130.

The first semiconductor chip 110 is secured to the die pad 131 of a lead frame by using a die bonding resin 132. The bonding pads 112 of the first semiconductor chip 110 are electrically connected to the outer leads 133 of the lead frame via bonding wires 123. The first semiconductor chip 110, the second semiconductor chip 120, the bonding wires 133, the die pad 131 and portions of the outer leads 133 are packaged with a sealing resin 135.

A method of producing the above-mentioned semiconductor device will be described below referring to FIGS. 17A to 17D. First, as shown in FIG. 17A, the solder bumps 123 are formed on the inner electrodes 121 of the second semiconductor chip 120 by electroplating. Regarding the forming of the solder bumps 123, after the second barrel metals 122 are formed on the wafer for the second semiconductor chip 120 by vapor deposition, a bump pattern is formed by using a resist, and the bumps 123 are formed by electrolytic solder plating. Next,the second barrier metals 122 are melted and removed by wet etching, with the solder bumps 123 used as masks, and then the solder pumps 123 are subjected to reflowing so as to have a hemispheric shape. Next, as shown in FIG. 17B, the insulating resin 130 is applied onto the first semiconductor chip 110 when the first semiconductor chip 110 is in a wafer state, and the solder bumps of the second semiconductor chip 120 are aligned with the inner electrodes 111 of the first semiconductor chip 110. Next, as shown in FIG. 17C, the second semiconductor chip 120 is mounted on the first semiconductor chip 110. The solder bumps 123 are then melted by heating so that the inner electrodes 121 of the second semiconductor chip 120 are joined with the inner electrodes 111 of the first semiconductor chip 110 by soldering. Next, as shown in FIG. 17D, the first semiconductor chips 110 in the wafer state are individually separated. In the end, as shown in FIG. 16, the first semiconductor chip 110 is die-bonded to the die pad 131 of the lead frame, the bonding pads 112 of the first semiconductor chip 110 are connected to the outer leads 133 of the lead frame by wire bonding, and packaging is carried out by using the sealing resin 135.

However, the structure of the above-mentioned conventional semiconductor device and the above-mentioned method of producing the semiconductor device have the following problems, since the connection between the first semiconductor chip and the second semiconductor chip is carried out by soldering by using the solder bumps.

(1) Since the first semiconductor chip is stacked on the second semiconductor chip by the face-down method, chips can be stacked up to only two layers.

(2) Since the metal bumps are used when the first semiconductor chip is stacked on the second semiconductor chip, the chips may be damaged, and the semiconductor components of the chips may be broken.

(3) Since the solder is melted during joining, the solder spreads sideways. As a result, dimensional changes occur, whereby it is difficult to attain fine structures.

(4) Since the inner electrodes of the semiconductor chips are usually made of Al, it is necessary to form a metal film capable of easily diffusing with the solder, such as a metal film of Ti, Cu, Au or the like, on each of the Al electrodes in order to properly carry out solder joining. This results in higher cost.

(5) Since it is difficult to attain fine structures, the inner electrodes of the first and second semiconductor chips become larger in size, thereby having larger electrical load capacities. This increases delay in signal transmission between the first and second semiconductor chips and also increases power consumption.

SUMMARY OR THE INVENTION

Accordingly, the present invention is intended to provide a high-performance semiconductor device wherein a plurality of chips can be stacked without damaging the chips and minute connection is attained easily, and also intended to provide a method of producing the semiconductor device.

A semiconductor device in accordance with claim 1 of the present invention comprises a first semiconductor chip having outer electrodes and inner electrodes, anda second semiconductor chip having inner electrodes, the second semiconductor chip being stacked on the first semiconductor chip with a space provided therebetween, and the inner electrodes being electrically connected to each other, wherein through holes are provided in the inner electrodes of the second semiconductor chip, electrodes capable of being plated by electroless plating are formed on the inner walls of the through holes while being insulated from other electrodes, the second semiconductor chip is secured with an adhesive to the first semiconductor chip at portions other than the outer electrodes and the inner electrodes of the first semiconductor chip so that the inner electrodes of the first semiconductor chip are aligned with the inner electrodes of the second semiconductor chip, and the inner electrodes of the second semiconductor chip and the electrodes on the inner walls of the through holes are electrically connected to the inner electrodes of the first semiconductor chip by continuously extending metals having the same composition.

By forming the through holes in the inner electrodes of the second semiconductor chip and by stacking the first and second semiconductor chips by using the adhesive as described above, a plurality of chips can be stacked without damaging the chips. The electrodes formed on the inner walls of the through holes and capable of being plated by electroless plating are made of Cu, Ni, Au, Pt, Ag, Sn, Pb, Co, etc. The inner electrodes of the second semiconductor chip and the electrodes on the inner walls of the through holes are electrically connected to the inner electrodes of the first semiconductor chip by the continuously extending metal shaving the same composition. For this reason, instead of the conventional joining using solder bumps, the metal deposited directly on the inner electrodes by electroless plating is used for joining. Therefore, unlike the case of the conventional method, it is not necessary to form a metal for causing solder diffusion beforehand on the inner electrodes of the chips.

A semiconductor device in accordance with claim 2 is a semiconductor device in accordance with claim 1, wherein the diameter of the thorough hole in the inner electrode of the second semiconductor chip is made smaller than the half of the space between the first semiconductor chipand the second semiconductor chip. Since the diameter of the thorough hole in the inner electrode of the second semiconductor chip is made smaller than the half of the space between the first semiconductor chip and the second semiconductor chip, secure connection can be attained. In other words, since the growth of a film plated by electroless plating is usually isotropic, if the diameter of the thorough hole is not less than the half of the space, when the wall of the through hole makes contact with a plated film, i.e., a metal formed on the electrode, the through hole is not filled with a plated metal, whereby a plating liquid remains inside the electrode. Since this remaining liquid causes corrosion, the above-mentioned setting is carried out so that the plating liquid does not remain inside the electrode.

A semiconductor device in accordance with claims 3 and 4 is a semiconductor device in accordance with claim 1, wherein the second semiconductor chips, two or more in number, are stacked. Since the second semiconductor chips, two or more in number, are stacked, this structure is applicable to LSIs having numerous pins.

Amethod of producing a semiconductor device in accordance with claim 5, comprises a step of providing the through holes in the inner electrodes of the second semiconductor chip to be stacked on the first semiconductor chip, a step of forming insulating films on the inner walls of the through holes and the rear face of the second semiconductor chip, a step of forming electrodes capable of being plated by electroless plating on the inner walls of the through holes by electroless plating or vapor deposition, a step of bonding and securing the second semiconductor chip to the first semiconductor chip at portions other than the outer electrodes and the inner electrodes of the first semiconductor chip so that the inner electrodes of the first semiconductor chip are aligned with the inner electrodes of the second semiconductor chip with a space provided to the first semiconductor chip, and a step of electrically connecting the inner electrodes of the second semiconductor chip and the inner walls of the through holes to the inner electrodes of the first semiconductor chip by electroless plating.

As described above, the through holes are provided in the inner electrodes of the second semiconductor chip, the first semiconductor chip and the second semiconductor chip are bonded and secured to each other, and the inner electrodes of the second semiconductor chip and the inner walls of the through holes are electrically connected to the inner electrodes of the first semiconductor chip by electroless plating. Therefore, a plurality of chips can be stacked without damaging the chips. In addition, electrodes capable of being plated by electroless plating are formed on the inner walls of the through holes by electroless plating or vapor deposition. Therefore, the conventional joining method using solder bumps is not used, and it is not necessary to form a metal for causing solder diffusion beforehand on the inner electrodes of the chips. Cu, Ni, Au, Pt, Ag, Sn, Pb, Co and the like for example can be used for the electrodes. Furthermore, since solder bump spreading does not occur, minute connection can be attained easily, thereby being applicable to LSIs having numerous pins. Moreover, when two LSI chips are joined to each other, one of the two LSI chips is used in a wafer state, whereby low cost production is made possible.

Methods of producing the semiconductor device in accordance with claims 6, 7 and 8 have effects similar to those of claims 2, 3 and 4 respectively.

BRIEF DESCRIPTION OF THE DRAWINGS

FIG. 3A is a sectional view showing a step of a method of producing the semiconductor device in accordance with the embodiment of the present invention, and FIG. 3B is a magnified view of the main portion thereof;

FIG. 5A is a sectional view showing the next step of the step shown in FIG. 4A, and FIG. 5B is a magnified view of the main portion thereof;

FIG. 6A is a sectional view showing the next step of the step shown in FIG. 5A, and FIG. 6B is a magnified view of the main portion thereof;

FIG. 7A is a sectional view showing the next step of the step shown in FIG. 6A, and FIG. 7B is a magnified view of the main portion thereof;

FIG. 12 is a sectional view showing the next step of the step shown in FIG. 11;

FIG. 13 is a sectional view showing the next step of the step shown in FIG. 12;

FIG. 14A is a sectional view showing the next step of the step shown in FIG. 13, and FIG. 14B is a magnified view of the main portion thereof;

DESCRIPTION OF PREFERRED EMBODIMENTS

Figure 1:
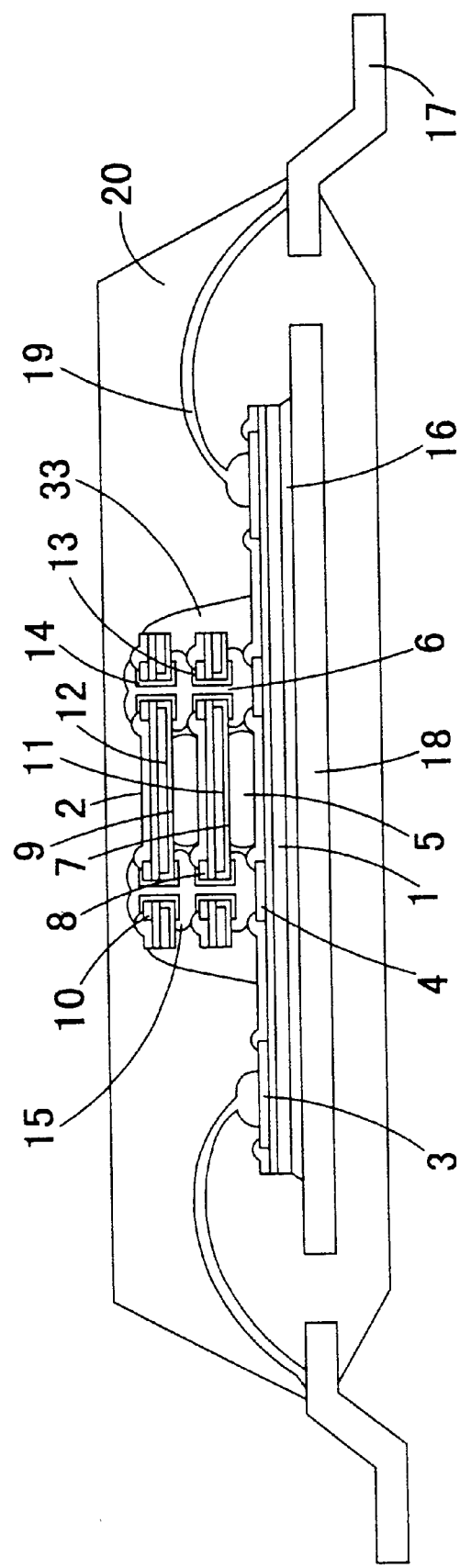
FIG. 1 is a sectional view showing a semiconductor device in accordance with an embodiment of the present invention.
Figure 2:
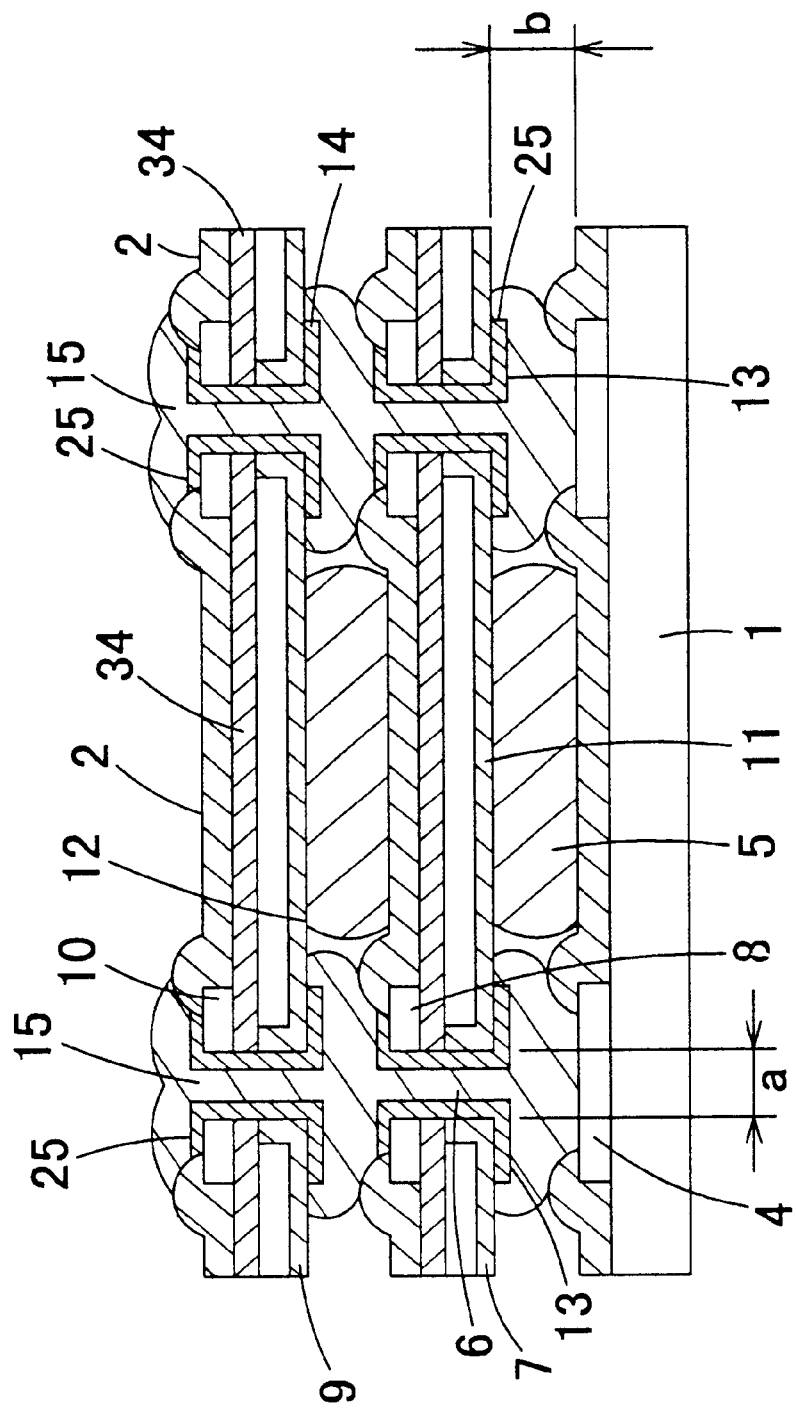
FIG. 2 is a magnified view showing the main portion of FIG. 1.

An embodiment of the present invention will be described below referring to FIGS. 1 to 15. FIG. 1 is a sectional view showing a semiconductor device in accordance with an embodiment of the present invention. FIG. 2 is a magnified view showing the main portion of FIG. 1. FIGS. 3 to 15 are sectional views showing steps of a method of producing the semiconductor device in accordance with the embodiment of the present invention.

In FIGS. 1 and 2, numeral 1 designates a first semiconductor chip, numeral 2 designates the protective film of the semiconductor chip, numeral 3 designates an outer electrode of the first semiconductor chip, numeral 4 designates an inner electrode of the first semiconductor chip, numeral 5 designates an adhesive, numeral 6 designates a through hole, numeral 7 designates a second semiconductor chip, numeral 8 designates an inner electrode of the second semiconductor chip, numeral 9 designates a third semiconductor chip, numeral 10 designates an inner electrode of the third semiconductor chip, numeral 11 designates the oxide film of the second semiconductor chip, numeral 12 designates the oxide film of the third semiconductor chip, numeral 13 designates a plated electrode (a second plated electrode) of the second semiconductor chip, numeral 14 designates a plated electrode (a third plated electrode) of the third semiconductor chip, numeral 15 designates a plated electrode (a second electrode), numeral 16 designates a die-bonding resin, numeral 17 designates a lead of a lead frame, numeral 18 designates the die pad of the lead frame, numeral 19 designates a die bonding wire, numeral 20 designates a sealing resin, numeral 21 designates a wafer for the second semiconductor chips, numeral 22 designates a wafer for the third semiconductor chips, numeral 23 designates an electroless plating liquid, numeral 24 designates an electroless plating bath, numeral 25 designates a plated metal film (a first metal), numeral 26 designates a resist, numeral 27 designates an etching liquid, numeral 28 designates an etching bath, numeral 29 designates the wafer for the first semiconductor chips, numeral 30 designates a collet, numeral 31 designates the vacuum hole of the collet, numeral 32 designates a dicing groove, numeral 33 designate an insulating resin, and numeral 34 designates an oxide film.

As shown in FIG. 1, the first semiconductor chip 1 having the outer electrodes 3 and the inner electrodes 4 is secured with the adhesive 5 to the second and third semiconductor chips 7 and 9 with spaces provided therebetween at portions other than the outer electrodes 3 and the inner electrodes 4, 8 and 10. In addition, the second and third semiconductor chips 7 and 9 have the through holes 6 in the inner electrodes 8 and 10 of the second and third semiconductor chips 7 and 9, passing through the semiconductor chips to their rear faces. The through holes 6 and the rear faces of the second and third semiconductor chips 7 and 9 are coated with the oxide films 11 and 12 of the second and third semiconductor chips so as to be insulated from the inner components. As shown in FIGS.1 and 2, the plated electrode 13 capable of being plated by electroless plating and made of Cu, Ni, Au, Pt, Ag, Sn, Pb, Co, etc. is formed on the inner walls of the through holes. Furthermore, the inner electrodes 8 and 10 of the second and third semiconductor chips and the through holes 6 are electrically connected to the inner electrodes 4 of the first semiconductor chip by the continuously extending plated electrodes 15 having the same composition.

Next, a method of producing the semiconductor device having the above-mentioned structure will be described.

Figure 4A:
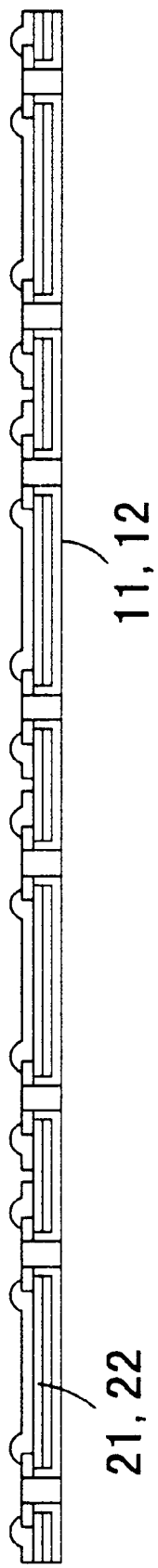
FIG. 4A is a sectional view showing the next step of the step shown in FIG. 3A.
Figure 4B:
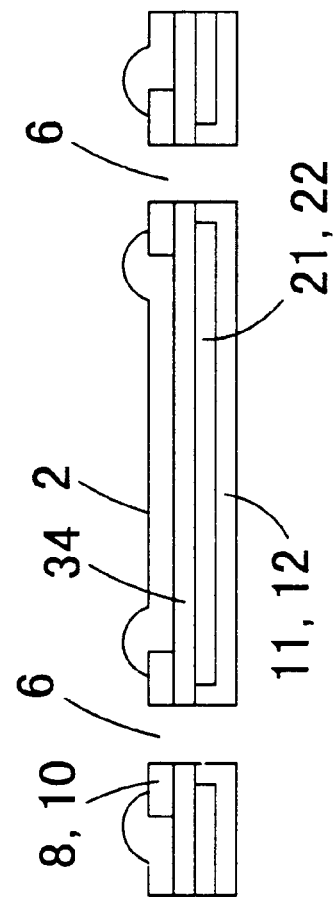
FIG. 4B is a magnified view of the main portion thereof.

First, as shown in FIGS. 3A and 3B, the through holes 6 measuring about 10μm in diameter are made in the inner electrodes 8 and 10 of the second and third semiconductor chips of the wafers 21 and 22 for the second and third semiconductor chips by a laser. The size of the inner electrode should be only 15 μm square or more. Next, as shown in FIGS. 4A and 4B, the oxide films 11 and 12 of the second and third semiconductor chips are formed on the side faces of the through holes 6 and the rear faces of the wafers 21 and 22 for the second and third semiconductor chips. These oxide films 11 and 12 are used as insulating films for providing insulation from the inner components of the semiconductor chips when the electrodes are formed by the electroless plating method.

Next, as shown in FIGS. 5A and 5B, the plated metal film 25 is formed on the wafers 21 and 22 for the second and third semiconductor chips and the through holes 6 so as to cover the entire faces of the wafers by electroless plating. In the case when the plated metal film 25 formed by electroless plating is Ni for example, the wafers 21 and 22 for the second and third semiconductor chips are dipped in a solution of palladium chloride so that palladium is attached to the entire faces of the wafers as a core for electroless plating. After this, the wafers are dipped in an electroless Ni plating solution so as to form the plated metal film 25 made of Ni and having a thickness of about 1μm. Next, as shown in FIGS. 6A and 6B, an etching pattern is formed by using the resist 26 on the through holes 6 and the inner electrodes 8 and 10 of the second and third semiconductor chips of the wafers for the second and third semiconductor chips to remove the plated metal film 25.

Figure 8A:
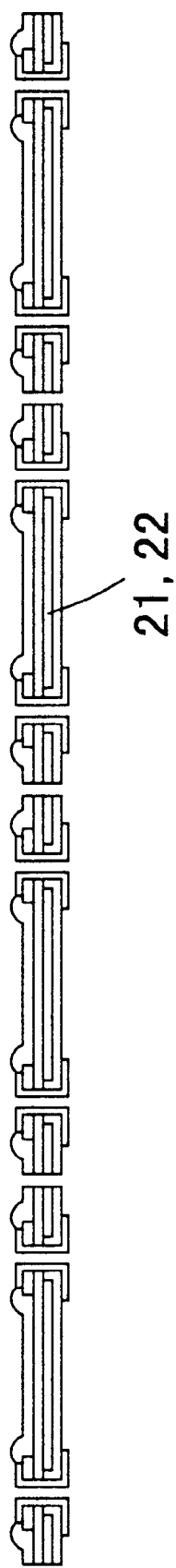
FIG. 8A is a sectional view showing the next step of the step shown in FIG. 7A.
Figure 8B:
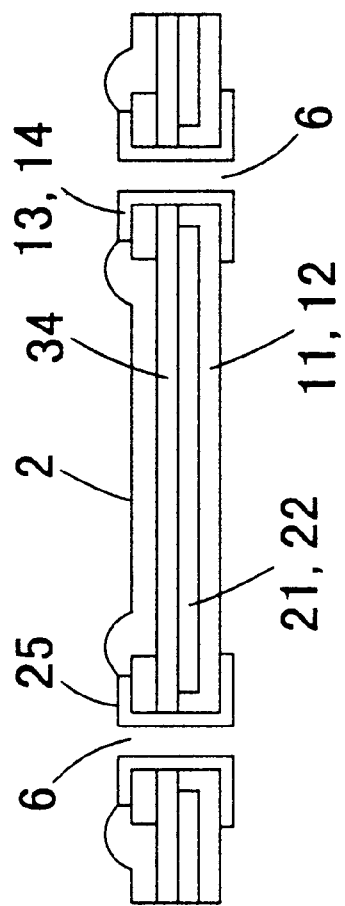
FIG. 8B is a magnified view of the main portion thereof.
Figure 9A:
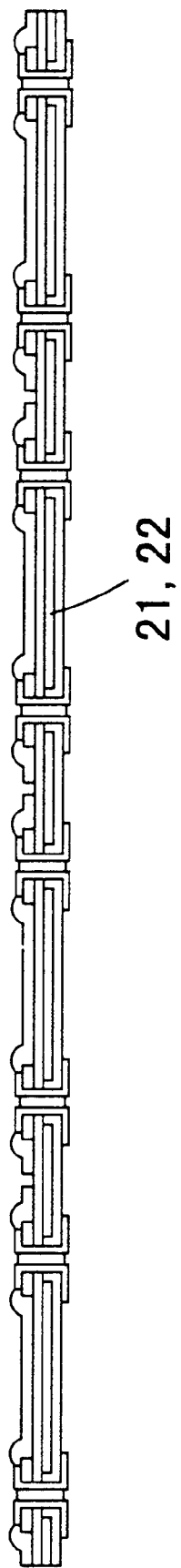
FIG. 9A is a sectional view showing the next step of the step shown in FIG. 8A.
Figure 9B:
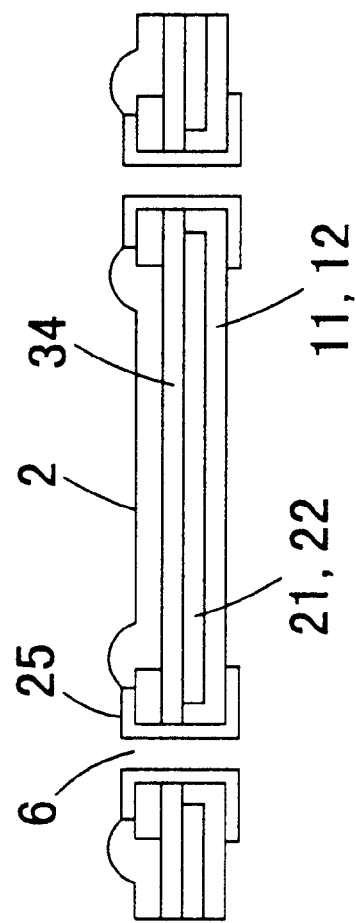
FIG. 9B is a magnified view of the main portion thereof.

Next, as shown in FIGS. 7A and 7B, the wafers 21 and 22 for the second and third semiconductor chips on which the etching pattern is formed by using the resist 26 are dipped in the etching liquid 27 inside the etching bath 28 so that the plated metal film 25 is dissolved and etched. In the case when the plated metal film is Ni for example, the Ni film is dissolved by a solution of 20% hydrochloric acid. Next, as shown in FIGS. 8 and 8B, the resist 26 formed on the wafers 21 and 22 for the second and third semiconductor chips is dissolved and removed thereby to form the second and third plated electrodes 13 and 14. Next, as shown in FIGS. 9A and 9B, the wafers 21 and 22 for the second and third semiconductor chips are diced and separated into individual chips.

Figure 10:
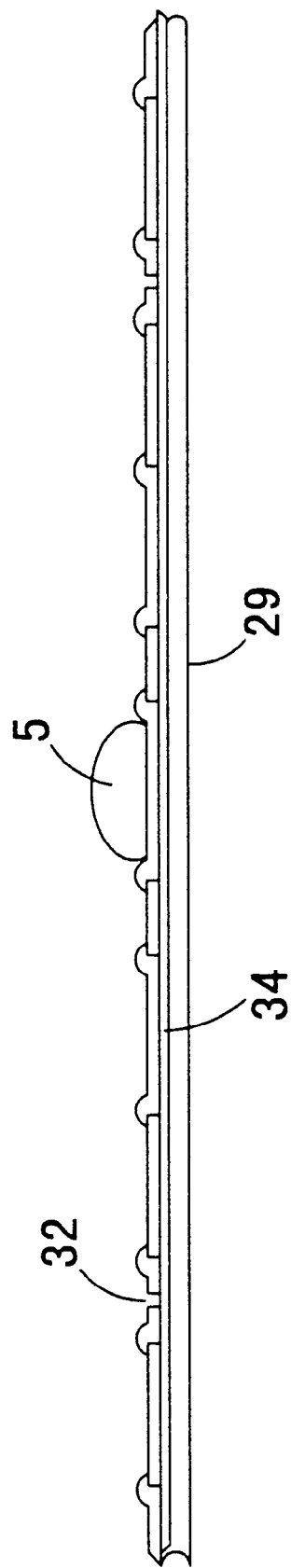
FIG. 10 is a sectional view showing the next step of the step shown in FIG. 9A.
Figure 11:
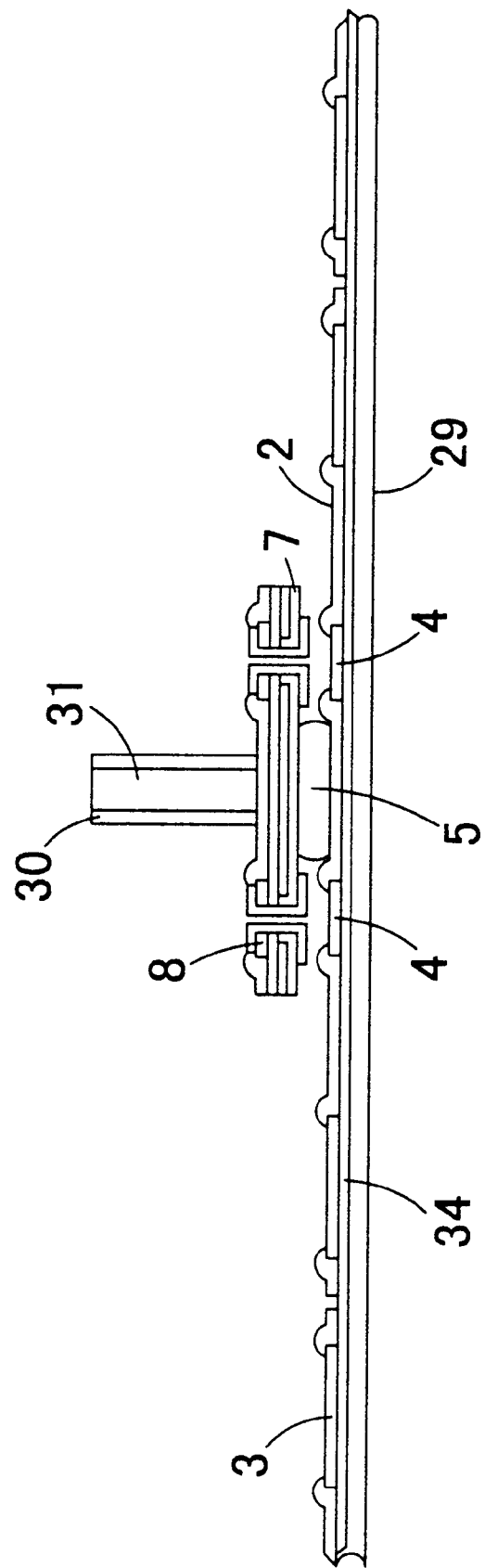
FIG. 11 is a sectional view showing the next step of the step shown in FIG. 10.

Next, as shown in FIG. 10, the adhesive 5 made of epoxy, polyimide, acryl or the like is applied to the wafer 29 for the first semiconductor chip 1 at a position on which the second semiconductor chip 7 is mounted later, while preventing the inner electrodes 4 and the outer electrodes 3 of the first semiconductor chip from being blocked. Next, as shown in FIG. 11, the second semiconductor chip 7 is mounted face-up on the wafer 29 for the first semiconductor chip in the area to which the adhesive 5 has been applied, while the second semiconductor chip 7 is held with the collet 30 by vacuum suction so that the inner electrodes 4 and 8 are aligned with each other. The adhesive 5 is then cured by heating via the collet 30, whereby the second semiconductor chip 7 is secured onto the wafer 29 for the first semiconductor chip. The temperature of the heating is in the range of about 100° C. to 300° C. Since the inner electrodes 4 and 8 are electrodes used to connect the second semiconductor chip 7 to the wafer 29 for the first semiconductor chip, they may be small in size, that is, in the range of about several vm square to 100μm square. In addition, at this time, the space between the surfaces of the first semiconductor chip 1 and the second semiconductor chip 7 is in the range of several am to 100 μm. Furthermore, the adhesive 5 is prevented from flowing over the surfaces of the inner electrodes 4 and 8. By repeating this process, a plurality of the second semiconductor chips 7 are secured onto the wafer 29 for the first semiconductor chip with the adhesive 5.

Furthermore, as shown in FIG. 12, the adhesive 5 made of epoxy, polyimide, acryl or the like is applied to the second semiconductor chip 7 at a position on which the third semiconductor chip 9 is mounted later, while preventing the inner electrodes 8 from being blocked. Next, as shown in FIG. 13, the third semiconductor chip 9 is mounted face-up on the second semiconductor chip 7 in the area to which the adhesive 5 has been applied, while the third semiconductor chip 9 is held with the collet 30 by vacuum suction so that the inner electrodes 8 and 10 are aligned with each other. The adhesive 5 is then cured by heating via the collet 30, whereby the third semiconductor chip 9 is secured onto the second semiconductor chip 7.

Next, as shown in FIGS. 14A and 14B, the wafer 29 for the first semiconductor chip is dipped in the electroless plating bath 24, whereby the plated metals deposited from the second and third plated electrodes 13 and 14 formed on the inner electrodes 4 of the first semiconductor chip and the inner electrodes 8 and 10 of the second and third semiconductor chips are integrated, thereby forming the plated electrodes 15. By the plated electrodes 15, the inner electrodes 4 of the first semiconductor chip 1 are electrically connected to the inner electrodes 8 and 10 of the second and third semiconductor chips 7 and 9. At this time, the electroless plating liquid 23 enters the through holes 6 and the spaces between the wafer 29 for the first semi cond uct or chip and the second and third semiconductor chips 7 and 9. In the case when the inner electrodes 4 of the first semiconductor chip are made of Al and the metal to be deposited by electro less plating is Ni, the wafer is first dipped in a solution of nitric acid, phosphoric acid or the like to remove the oxide films on the Al surfaces of the inner electrodes 4 of the first semiconductor chip, and then the Al surfaces are replaced with zinc or the like. In addition, by using the same electroless plating liquid as that used for the second and third plated electrodes 13 and 14 formed on the second and third semiconductor chips 7 and 9, the metal used for electroless plating is also deposited on the second and third plated electrodes 13 and 14, whereby the inner electrodes 4, 8 and 10 of the first, second and third semiconductor chips can be connected to one another by using the same plated metal. At this time, by further plating gold by electroless plating on the surfaces of the platedmetal Ni, the reliability of the device can be improved, and the yield of the device can be enhanced greatly when bonding wires and the like are joined to the outer electrodes 4 later. After the wafer is dipped in the respective solutions and treated, it is washed in a solution such as pure water, and subjected to the next process. As described above, instead of the conventional joining using solder bumps, the metal deposited directly on the Al electrodes by electroless plating is used for joining. Therefore, unlike the case of the conventional method, it is not necessary to form a metal for causing solder diffusion beforehand on the Al electrodes. In addition, all the chips can be joined simultaneously while they are in the wafer state. As a result, the productivity can be raised significantly, and joining can be attained at low cost and in high density.

Figure 15:
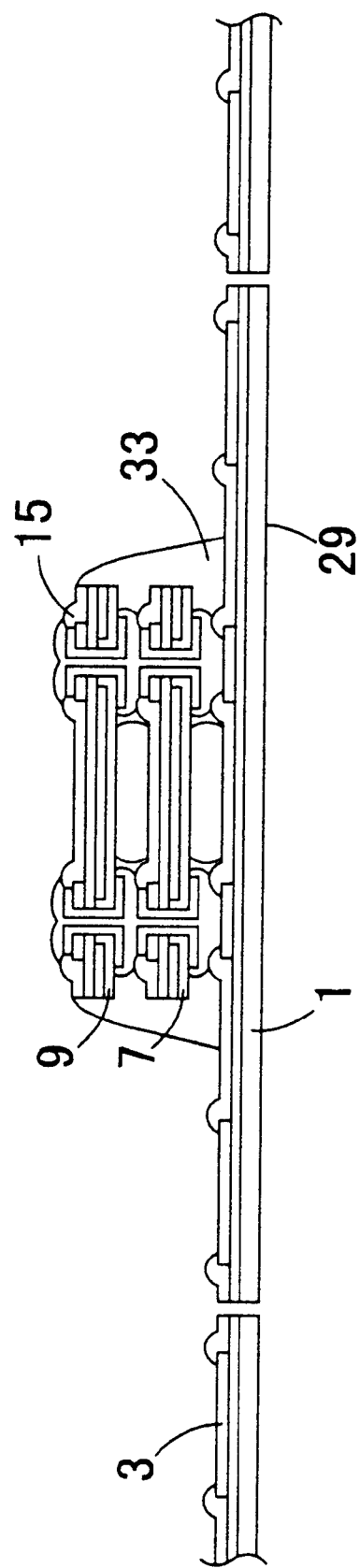
FIG. 15 is a sectional view showing the next step of the step shown in FIG. 14A.
Figure 16:
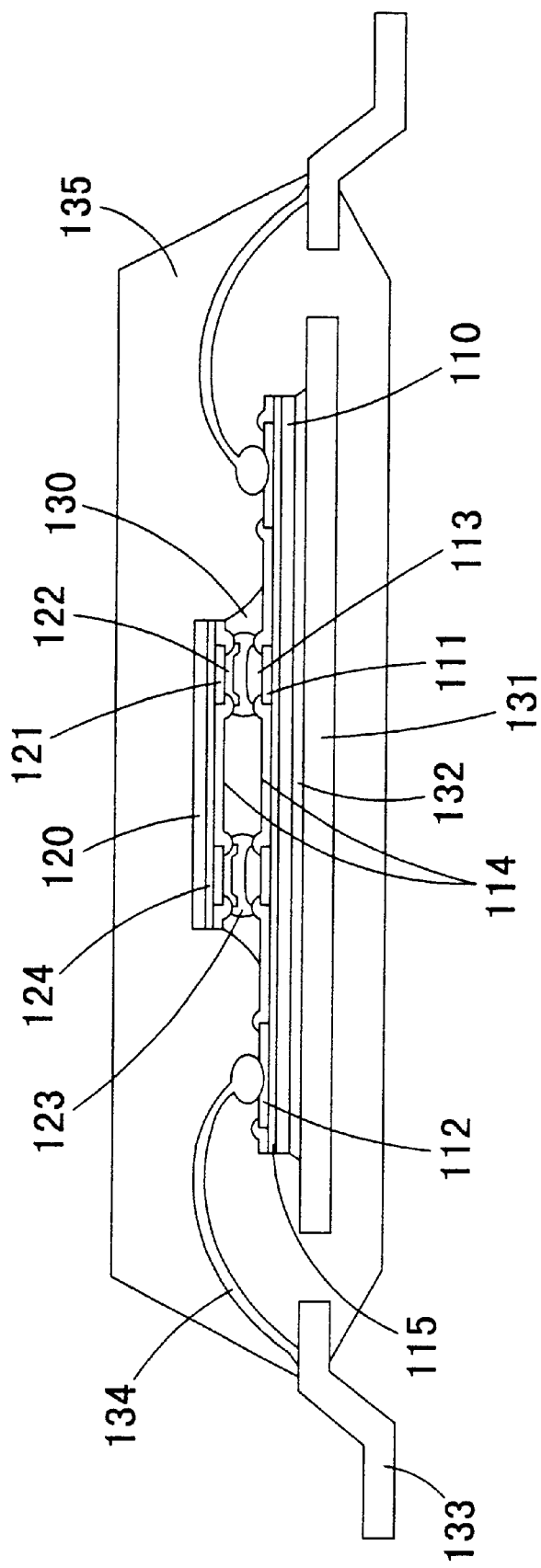
FIG. 16 is a sectional view showing a conventional semiconductor device.
Figure 17A:
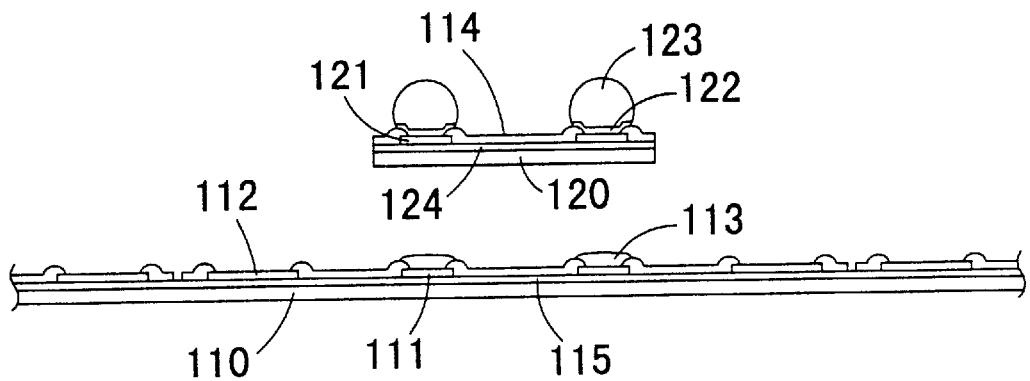
FIGS. 17A, 17B and 17C are sectional views showing steps of a method of producing the conventional semiconductor device.
Figure 17B:
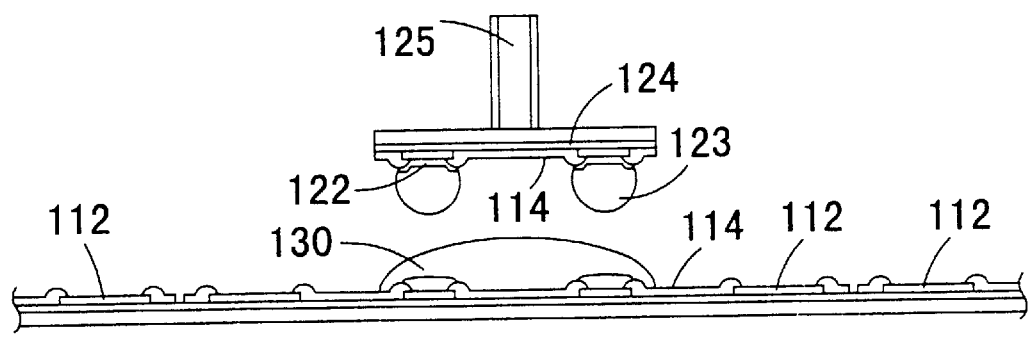
Figure 17C:
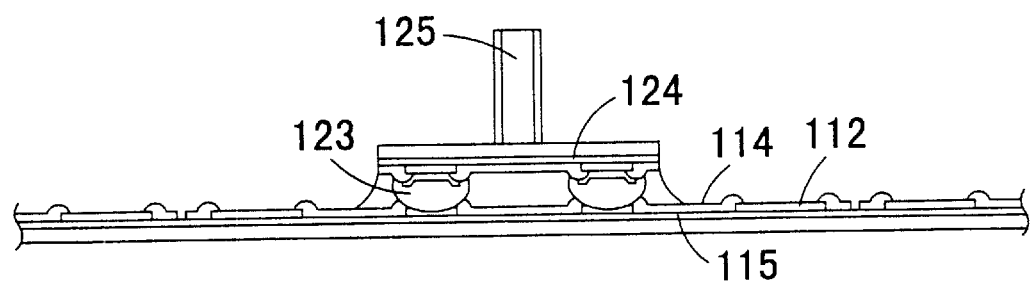
Figure 17D:
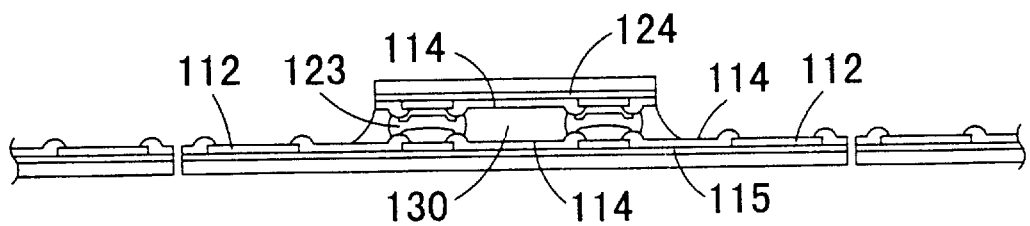

Next, as shown in FIG. 15, the wafer 29 for the first semiconductor chips is diced and separated into the first semiconductor chips 1. Before the wafer is separated into the first semiconductor chips 1, probing is performed for the outer electrodes 3 of the first semiconductor chips, whereby a characteristic test can be conducted while the first semiconductor chips 1, the second semiconductor chips 7 and the third semiconductor chips 9 are joined to one another. In addition, the insulating resin 33 is provided on the side portions.

Next, as shown in FIGS. 1 and 2, the first semiconductor chip 1 to which the second and third semiconductor chips 7 and 9 are joined is bonded to the die pad 18 of the lead frame with the die-bonding resin 16, and the outer electrodes 3 of the first semiconductor chip 1 are connected to the leads 17 of the lead frame by using the bonding wires 19. In the end, the whole is sealed with the sealing resin 20 so as to be packaged. When the sealing resin 20 is poured into a metal mold, it is supplied into the spaces between the first semiconductor chip 1, the second semiconductor chip 7 and the third semiconductor chip 9. Furthermore, the pouring of the resin into the spaces between the first semiconductor chip 1, the second semiconductor chip 7 and the third semiconductor chip 9 may be carried out before the sealing by using the insulating resin 16 different from the sealing resin 20 used for packaging. Furthermore, it is not necessary to pour the sealing resin into the spaces between the first semiconductor chip 1, the second semiconductor chip 7 and the third semiconductor chip 9. In addition, the semiconductor chips to be stacked may be mounted in either the face-up method or the face-down method, provided that the positional relationship between the inner electrodes of the second semiconductor chip 7 and the third semiconductor chip 9 and those of the first semiconductor chip 1 does not cause any problems in circuit.

As described above, in the present embodiment, the through holes 6 are provided in the inner electrodes 8 and 10 of the second and third semiconductor chips, the first, second and third semiconductor chips 1, 7 and 9 are bonded so as to be secured, and the inner electrodes 4 of the first semiconductor chip are electrically connected by electroless plating to the inner electrodes 8 and 10 of the second and third semiconductor chips and the first metals 25 (the plated electrodes 13) on the inner walls of the thorough holes. Therefore, a plurality of chips can be stacked without being damaged. In addition, the first metals 25 (the plated electrodes 13) capable of being plated by electroless plating is formed on the inner walls of the through holes by electroless plating or by vapor deposition. Therefore, unlike the case of the conventional joining using solder bumps, it is not necessary to form a metal for causing solder diffusion beforehand on the inner electrodes of the chips. Furthermore, since solder bump spreading does not occur, minute connection can be attained easily, thereby being applicable to LSIs having numerous pins. As the first metal (the plated electrode 13), Cu, Ni, Au, Pt, Ag, Sn, Pb, Co and the like for example can be used.

Moreover, the diameter of the thorough hole 6 in the inner electrode 8 of the second semiconductor chip may be smaller than the half of the space between the first semiconductor chip 1 and the second semiconductor chip 7. In other words, in FIG. 2, dimension a is the diameter of the through hole in the inner electrode of the second semiconductor chip, and dimension b is the space between the first semiconductor chip and the second semiconductor chip. In the case of a >b/2, before being filled with the plated metal (the plated electrode 15), the wall of the thorough hole 6 makes contact with the plated metal (the plated electrode 13 of the second semiconductor chip and the like) grown from another electrode. Therefore, the plating liquid remains inside the thorough hole 6. In the case of a ≦b/2, the through hole 6 is filled with the plated metal before its wall makes contact with the plated metal grown from the other electrode. Therefore, secure connection can be attained without leaving the plating liquid inside the through hole 6.

Although the case wherein the second and third semiconductor chips are stacked is described above, the second semiconductor chips, two or more in number, may be stacked. Furthermore, the first semiconductor chip to which the second semiconductor chip is connected may be configured not only in a wafer sate but also as a circuit board.

What is claimed is:

1. A semiconductor device comprising a first semiconductor chip having outer electrodes and inner electrodes, and a second semiconductor chip having inner electrodes, said second semiconductor chip being stacked on said first semiconductor chip with a space provided therebetween, and said inner electrodes being electrically connected to each other, wherein through holes are provided in said inner electrodes of said second semiconductor chip, electrodes capable of being plated by electroless plating are formed on the inner walls of said through holes while being insulated from other electrodes, said second semiconductor chip is secured with an adhesive to said first semiconductor chip at portions other than said outer electrodes and said inner electrodes of said first semiconductor chip so that said inner electrodes of said first semiconductor chip are aligned with said inner electrodes of said second semiconductor chip, and said inner electrodes of said second semiconductor chip and said electrodes on said inner walls of said through holes are electrically connected to said inner electrodes of said first semiconductor chip by continuously extending metals having the same composition, and the diameter of said through hole in said inner electrode of said second semiconductor chip is made smaller than one half of the space between said first semiconductor chip and said second semiconductor chip.

2. A semiconductor device in accordance with claim 1, wherein a third semiconductor chip having the same structure as that of said second semiconductor chip is stacked on said second semiconductor chip just as said second semiconductor chip is stacked.

3. A semiconductor device in accordance with claim 1, wherein a plurality of semiconductor chips having the same structure as that of said second semiconductor chip are stacked on said second semiconductor chip just as said second semiconductor chip is stacked.

4. The semiconductor device according to claim 1, where gold is plated on the surfaces of said metals by electroless plating, and an insulating resin is provided on the side of said second semiconductor chip.

\* \* \* \* \*

UNITED STATES PATENT AND TRADEMARK OFFICE
CERTIFICATE OF CORRECTION

PATENT NO.     : 6,534,874 B1
DATED          : March 18, 2003
INVENTOR(S)    : Kazuhiko Matsumura It is certified that error appears in the above-identified patent and that said Letters Patent is hereby corrected as shown below:

<u>Title page,</u>
Item [73], Assignee, Matsushita Electronics Corporation, Osaka, (JP)" should read
-- Matsushita Electric Industrial Co., Ltd., Osaka, (JP) --

Signed and Sealed this

Seventeenth Day of February, 2004

JON W. DUDAS
*Acting Director of the United States Patent and Trademark Office*